US012782805B2

(12) United States Patent
Kim et al.

(10) Patent No.: US 12,782,805 B2
(45) Date of Patent: Nov. 3, 2026

(54) METHOD OF CLEANING SUBSTRATE FOR BLANK MASK, SUBSTRATE FOR BLANK MASK, AND BLANK MASK INCLUDING THE SAME

(71) Applicant: LuminaMask Co., Ltd., Cheonan-si (KR)

(72) Inventors: Taewan Kim, Seoul (KR); GeonGon Lee, Seoul (KR); Suk Young Choi, Seoul (KR); Suhyeon Kim, Seoul (KR); Sung Hoon Son, Seoul (KR); Seong Yoon Kim, Seoul (KR); Min Gyo Jeong, Seoul (KR); Hahyeon Cho, Seoul (KR); Inkyun Shin, Seoul (KR); Hyung-joo Lee, Seoul (KR)

(73) Assignee: LuminaMask Co., Ltd., Cheonan-si (KR)

( * ) Notice: Subject to any disclaimer, the term of this patent is extended or adjusted under 35 U.S.C. 154(b) by 872 days.

(21) Appl. No.: 17/888,726

(22) Filed: Aug. 16, 2022

(65) Prior Publication Data

US 2023/0064333 A1 Mar. 2, 2023

(30) Foreign Application Priority Data

Aug. 20, 2021 (KR) ........................ 10-2021-0110129

(51) Int. Cl.

| | |
|---|---|
| ***G03F 1/82*** | (2012.01) |
| ***B08B 3/08*** | (2006.01) |
| ***B08B 3/10*** | (2006.01) |
| ***B08B 7/00*** | (2006.01) |
| ***B08B 7/04*** | (2006.01) |
| ***G03F 1/60*** | (2012.01) |

(52) U.S. Cl.

CPC .................. *G03F 1/82* (2013.01); *B08B 3/08* (2013.01); *B08B 3/10* (2013.01); *B08B 7/0042* (2013.01); *B08B 7/0057* (2013.01); *B08B 7/04* (2013.01); *G03F 1/60* (2013.01)

(58) Field of Classification Search

CPC ..... G03F 1/82; G03F 1/60; B08B 3/08; B08B 3/10; B08B 7/0042; B08B 7/0057; B08B 7/04

See application file for complete search history.

(56) References Cited

U.S. PATENT DOCUMENTS 7,763,399 B2 * 7/2010 Sengupta ............ G03F 7/70916 134/1
8,764,905 B1 * 7/2014 Zimmerman ........... G03F 7/423 134/1.1
2002/0192391 A1 12/2002 Wada et al.
2004/0192063 A1 * 9/2004 Koike ..................... B24B 49/12 438/689
2007/0012336 A1 * 1/2007 Su ......................... B08B 7/0071 134/28
2007/0295355 A1 * 12/2007 Ikuta ................. H01L 21/67115 134/1
2009/0061327 A1 * 3/2009 Sengupta .................. G03F 1/82 430/5

FOREIGN PATENT DOCUMENTS

| | | | |
|---|---|---|---|
| CN | 1958177 | A | 5/2007 |
| CN | 102553122 | A | 7/2012 |
| CN | 102566257 | A | 7/2012 |
| CN | 102989715 | A | 3/2013 |
| CN | 104709964 | A | 6/2015 |
| CN | 104858193 | A | 8/2015 |
| CN | 112473362 | A | 3/2021 |
| JP | 2000-15196 | A | 1/2000 |
| JP | 2001-293443 | A | 10/2001 |
| JP | 2002-82426 | A | 3/2002 |
| JP | 2004-29736 | A | 1/2004 |
| JP | 2004-356403 | A | 12/2004 |
| JP | 2006-7052 | A | 1/2006 |
| JP | 2008-51880 | A | 3/2008 |
| JP | 2010-117403 | A | 5/2010 |
| JP | 2012-133343 | A | 7/2012 |
| JP | 2015-22150 | A | 2/2015 |
| KR | 10-1997-0003569 | A | 1/1997 |
| KR | 10-0316374 | B1 | 9/2002 |
| KR | 10-0745065 | B1 | 8/2007 |
| KR | 10-2012-0005576 | A | 1/2012 |
| KR | 10-2018-0099037 | A | 9/2018 |
| TW | 200745782 | A | 12/2007 |
| WO | WO 2017/104370 | A1 | 6/2017 |

* cited by examiner

*Primary Examiner* — Alexander Markoff
(74) *Attorney, Agent, or Firm* — NSIP Law

(57) ABSTRACT

A method of cleaning a substrate for a blank mask including: a first cleaning including irradiating a cleaning target substrate with a pre-treatment light to prepare a substrate cleaned with light, and a second cleaning including applying a first cleaning solution and a post-treatment light to the substrate cleaned with light to prepare the substrate for the blank mask, is disclosed.

9 Claims, No Drawings

METHOD OF CLEANING SUBSTRATE FOR BLANK MASK, SUBSTRATE FOR BLANK MASK, AND BLANK MASK INCLUDING THE SAME

CROSS-REFERENCE TO RELATED APPLICATIONS

This application claims the benefit under 35 U.S.C. 119(a) of Korean Patent Application No. 10-2021-0110129 filed on Aug. 20, 2021 in the Korean Intellectual Property Office, the entire disclosure of which is incorporated herein by reference for all purposes.

BACKGROUND

1. Field

The present disclosure relates to a method of cleaning a substrate for blank mask, a substrate for a blank mask, and a blank mask including the same

2. Description of Related Art

Due to high integration of semiconductor devices or the like, miniaturization of circuit patterns of semiconductor devices is on demand. For this reason, the importance of a lithography technique, which is a technique for developing a circuit pattern on a wafer surface using a photomask, is being further emphasized.

To develop a miniaturized circuit pattern, an exposure light source used in an exposure process (photolithography) is required to have a short wavelength. Recently, ArF excimer laser (wavelength of 193 nm) or the like is used as the exposure light source.

A blank mask includes a transparent substrate and a thin film such as a light shielding film disposed on the transparent substrate. The transparent substrate may be manufactured through a shaping machining, a polishing process, a cleaning process, and the like of a material having a light transmitting characteristic.

As a circuit pattern is miniaturized, it is required to suppress a defect, which can be generated in the manufacturing process of a blank mask, further effectively. Among defects, which can be generated in the final blank mask, one caused from the transparent substrate may be present. To develop predetermined minute circuit pattern, it is required that the characteristics such as flatness and surface roughness of the transparent substrate are elaborately controlled, and it is also required that defects, particles, and the like of the transparent substrate itself are more decreased.

SUMMARY

In one general aspect, a method of cleaning a substrate for a blank mask according to one embodiment includes: a first cleaning including irradiating a cleaning target substrate with a pre-treatment light to prepare a substrate cleaned with light, and a second cleaning including applying a first cleaning solution and a post-treatment light to the substrate cleaned with light to prepare the substrate for the blank mask.

The pre-treatment light may be a light with a wavelength of 50 nm to 300 nm.

The post-treatment light may be a light with wavelength of 50 nm to 450 nm.

An intensity of the pre-treatment light may be 25 $mW/cm^2$ or more.

The cleaning target substrate may be irradiated with the pre-treatment light from two or more light sources.

A UI (Uniform Intensity) value of the pre-treatment light from the two or more light sources according to Equation 1 below may be 20% or less:

$$UI(\%) = \frac{I_{max} - I_{min}}{I_{max} + I_{min}} \times 100 \quad \text{[Equation 1]}$$

where, in Equation 1, $I_{max}$ is a maximum intensity among intensities of the pre-treatment light from the two or more light sources and Imin is a minimum intensity among intensities of the pre-treatment light from the two or more light sources.

The first cleaning may be performed in a depressurizing atmosphere.

The cleaning target substrate may be disposed in an atmosphere, where an exhaust pressure of 0.01 kPa to 1 kPa is applied.

The first cleaning solution may include at least one selected from the group consisting of SC-1 (Standard Clean-1) solution, ozone water, ultrapure water, hydrogen water, and carbonated water.

The SC-1 solution may be a solution including $NH_4OH$, $H_2O_2$, and $H_2O$.

The substrate cleaned with light may be one, from which some or all of compounds absorbing a light with a wavelength of 100 to 190 nm are removed.

The first cleaning solution may include a hydroxyl radical precursor.

A hydroxyl radical may be formed when the first cleaning solution is applied and the post-treatment light is irradiated on the substrate cleaned with light.

The substrate for the blank mask may include a sulfuric acid ion in an amount of 0 $ng/cm^2$ to 0.1 $ng/cm^2$, a nitric acid ion in an amount of 0 $ng/cm^2$ to 0.4 $ng/cm^2$, a nitrous acid ion in an amount of 0 $ng/cm^2$ to 0.05 $ng/cm^2$, and an ammonium ion in an amount of 0 $ng/cm^2$ to 1.5 $ng/cm^2$, as residual ions measured by an ion chromatography.

The PRE (Particle Removal Efficiency) value of the substrate for the blank mask may be 90% or more according to Equation 2 below:

$$PRE(\%) = \frac{P_b - P_a}{P_b} \times 100 \quad \text{[Equation 2]}$$

where, in Equation 2, $P_b$ is a number of particles measured at the cleaning target substrate and the $P_a$ is a number of particles measured at the substrate for the blank mask.

In another general aspect, the substrate for the blank mask according to another embodiment may be a quartz substrate with a flatness of 0.5 μm or less.

The substrate for the blank mask may include a sulfuric acid ion in an amount of 0 $ng/cm^2$ to 0.1 $ng/cm^2$, a nitric acid ion in an amount of 0 $ng/cm^2$ to 0.4 $ng/cm^2$, a nitrous acid ion in an amount of 0 $ng/cm^2$ to 0.05 $ng/cm^2$, and an ammonium ion in an amount of 0 $ng/cm^2$ to 1.5 $ng/cm^2$, as residual ions measured by an ion chromatography.

The substrate for the blank mask may include a chloride ion in an amount of 0 $ng/cm^2$ to 0.1 $ng/cm^2$, as residual ions measured by the ion chromatography.

In another general aspect, the blank mask according to another embodiment may include the substrate for the blank mask.

Other features and aspects will be apparent from the following detailed description, the drawings, and the claims.

DETAILED DESCRIPTION

Hereinafter, example embodiments of the present disclosure will be described in detail with reference to the accompanying drawings so that they can be easily practiced by those skilled in the art to which the present invention pertains. However, the example embodiments may be embodied in many different forms and is not to be construed as being limited to the embodiments set forth herein.

In this disclosure, the term for degree like "about", "substantially" and the like is used for meaning values approximative from/to the value when a tolerance to be proper to referred meaning for manufacture and substance is presented. Additionally, these terms for degree are used to help understanding of example embodiments and to prevent that an unconscionable trespasser unjustly uses the presented content in which exact or absolute number is referred.

Throughout this disclosure, the phrase "combination(s) thereof" included in a Markush-type expression denotes one or more mixtures or combinations selected from the group consisting of components stated in the Markush-type expression, that is, denotes one or more components selected from the group consisting of the components are included.

Throughout this disclosure, the description of "A and/or B" means "A, B, or A and B."

Throughout this disclosure, terms such as "first", "second", "A", or "B" are used to distinguish the same terms from each other unless specially stated otherwise.

In this disclosure, "B being placed on A" means that B is placed in direct contact with A or placed over A with another layer or structure interposed therebetween and thus should not be interpreted as being limited to B being placed in direct contact with A.

In this disclosure, a singular form is contextually interpreted as including a plural form as well as a singular form unless specially stated otherwise.

In this disclosure, room temperature refers to 20 to 25° C.

In this disclosure, humidity refers to relative humidity.

In this disclosure, the intensity of a light refers to the intensity of a light source.

Due to high integration of semiconductor devices, a photomask with a high resolution is on demand, for developing a further minute pattern on a wafer. Not only developing a minute pattern with a narrower width (Critical Dimension, CD) on the surface of a wafer by forming a pattern film of a photomask to be elaborate, but also suppressing degradation of the resolution of a photomask caused from defects is considered to be important issues.

A substrate for a blank mask has a possibility of being attached with contaminators thereon during processes of move and storage. When contaminators remain on the surface of a substrate for a blank mask, they may cause a problem of degrading the resolution of a blank mask due to defects of a thin film formed on the substrate, change in transmittance of a substrate, and the like.

The inventors of the present disclosure confirmed that a contaminator remaining on the surface of the substrate can be effectively removed by a method including a first cleaning through light in the atmosphere with a certain condition and a second cleaning of applying both cleaning solution and light irradiation, and completed the present disclosure.

Hereinafter, a detailed description of the present disclosure will be described.

Cleaning Method of a Substrate for a Blank Mask

A cleaning method of a substrate for a blank mask according to one embodiment of the present disclosure includes: a first cleaning including irradiating a cleaning target substrate with a pre-treatment light to prepare a substrate cleaned with light, and a second cleaning including applying a first cleaning solution and a post-treatment light to the substrate cleaned with light to prepare the substrate for the blank mask.

The pre-treatment light may be a light with a wavelength of 50 nm to 300 nm.

The post-treatment light may be a light with a wavelength of 50 nm to 450 nm.

Any substrate applicable to a blank mask can be used as the cleaning target substrate without limitation. For example, the cleaning target substrate may be a substrate applicable to a blank mask for a semiconductor, having a size of 6 inched width, 6 inched length, and 0.25 inched thickness.

Before the first cleaning operation is performed, the cleaning target substrate and the light source can be disposed in a space, where the first cleaning operation is performed.

The space, where the first cleaning operation is performed, can be controlled to have an atmospheric temperature and pressure within a predetermined range in the embodiment. An atmospheric gas having a volume ratio in a predetermined range in the embodiment may be injected to the space and discharged from the space. The space where the first cleaning operation is performed may be a cleaning chamber.

The light source may be disposed to beam light on the surface of the cleaning target substrate with an even intensity overall. One or plurality of light sources may be disposed within the space, where the first cleaning operation is performed, to beam light with an even intensity overall.

The light source may irradiate the surface of the cleaning target substrate with a pre-treatment light. The light source may be for example, a UV lamp. The light source may be for example, a laser light source.

In the first cleaning operation, the cleaning target substrate may be cleaned with a light by irradiating a pre-treatment light to the cleaning target substrate. In detail, when the surface of the cleaning target substrate is irradiated with the pre-treatment light, some or the all of the particles including organic matters present on the surface of the cleaning target substrate may absorb the pre-treatment light. The molecular bonds in the organic matters can be broken and particles including the organic matters can be decomposed and removed by the pre-treatment light transferring energy to the particles.

In the first cleaning operation, the pre-treatment light may be irradiated to the surface to be cleaned on a cleaning target substrate to prepare a substrate cleaned with light. In such a case, an energy, which can sufficiently decompose organic matters, can be transferred to the surface to be cleaned by the pre-treatment light.

The wavelength of the pre-treatment light may be equal to or more than 50 nm and less than or equal to 300 nm. The wavelength of the pre-treatment light may be 70 nm or more. The wavelength of the pre-treatment light may be 100 nm or more. The wavelength of the pre-treatment light may be 190 nm or less. The wavelength of the pre-treatment light may be 180 nm or less. In such a case, the pre-treatment light may be easily absorbed to the particles including organic matters.

An intensity of the pre-treatment light may be 25 mW/cm$^2$ or more. The intensity of the pre-treatment light may be 40 mW/cm$^2$ or more. The intensity of the pre-treatment light may be 60 mW/cm$^2$ or more. The intensity of the pre-treatment light may be 200 mW/cm$^2$ or less. The intensity of the pre-treatment light may be 150 mW/cm$^2$ or less. In such a case, the pre-treatment light may transfer an energy, which can sufficiently decompose organic matters.

In the first cleaning operation, the pre-treatment light may be irradiated to the cleaning target substrate from two or more light sources. In such a case, the light intensities of each of the light sources for irradiating the pre-treatment light may be same. Alternatively, the light intensities of each of the light source may be different each other.

In the first cleaning operation, the UI value according to Equation 1 below may be 20% or less:

$$UI(\%) = \frac{I_{max} - I_{min}}{I_{max} + I_{min}} \times 100 \qquad \text{[Equation 1]}$$

In Equation 1, $I_{max}$ is a maximum intensity among intensities of the pre-treatment light from the light sources and $I_{min}$ is a minimum intensity among intensities of the pre-treatment light from the light sources.

In the first cleaning operation, the UI value may be 20% or less. The UI value may be 15% or less. The UI value may be 10% or less. The UI value may be 0% or more. In such a case, the pre-treatment light with an even intensity overall may be irradiated to the whole surface of the cleaning target substrate.

The pre-treatment light may be irradiated to the substrate for 50 seconds to 200 seconds. The pre-treatment light may be irradiated to the substrate for 70 seconds to 180 seconds. The pre-treatment light may be irradiated to the substrate for 100 seconds to 150 seconds. In such a case, organic matters remaining on the surface of the cleaning target substrate may be sufficiently decomposed, the time used for cleaning the substrate may be decreased, and thereby the efficiency of the cleaning process may be increased.

The first cleaning operation may be performed at a depressurizing atmosphere. A pressure for degassing may be applied to the atmosphere, where the cleaning target substrate is disposed. In such a case, it is possible to prevent the substrate surface from being contaminated by particle residues formed by the irradiation of the pre-treatment light. In addition, it is possible to suppress degradation of cleaning capacity of the light by suppressing the pre-treatment light to be absorbed by an atmospheric gas.

A depressurizing atmosphere may be applied to the first cleaning operation. In detail, the first cleaning operation may be performed at an atmosphere with a pressure of 50 Pa to 1000 Pa. The pressure of the atmosphere may be equal to or more than 100 Pa and less than or equal to 950 Pa. The pressure of the atmosphere may be equal to or more than 200 Pa and less than or equal to 500 Pa.

The first cleaning operation may be performed at an atmosphere, to which an exhaust pressure of 0.01 kPa to 1 kPa is applied. The first cleaning operation may be performed at an atmosphere, to which an exhaust pressure of 0.1 kPa to 0.8 kPa is applied. The first cleaning operation may be performed at an atmosphere, to which an exhaust pressure of 0.2 kPa to 0.5 kPa is applied.

The first cleaning operation may be performed at an inert atmosphere. The inert atmosphere refers to an atmosphere including an inert gas as a main ingredient.

Any gas having a low reactivity, which cannot cause a chemical reaction with a particle and the like in the first cleaning operation, may be applied as the inert gas without limitation. For example, $N_2$, He, Ar, and the like may be applied as an inert gas.

In the inert atmosphere, the atmospheric gas may include an inert gas in an amount of 90 volume % or more. In the inert atmosphere, the atmospheric gas may include an inert gas in an amount of 95 volume % or more. In the inert atmosphere, the atmospheric gas may include an inert gas in an amount of 99.99 volume % or less.

In such a case, the particle residues generated in the first cleaning operation may be stably emitted through the atmospheric gas.

The first cleaning operation may be operated at an oxidation atmosphere. The oxidation atmosphere refers to an atmosphere, in which a gas including a reactive oxygen species precursor is included.

The reactive oxygen species precursor is a material, which may form a reactive oxygen species when exposed to a pre-treatment light. The reactive oxygen species precursor may include an oxygen element. The reactive oxygen species may be for example, $O_2$ or $H_2O$.

The reactive oxygen species refers to an oxygen species with a higher reactivity compared to an oxygen gas in the ground state. As the reactive oxygen species, for example, there are an oxygen radical, a hydroxyl radical, ozone, oxygen in the excited state, and the like.

When the first cleaning operation is performed at an oxidation atmosphere, a reactive oxygen species may be formed through irradiation of the pre-treatment light. In such a case, the pre-treatment light may break the molecular bond within organic matters included in particles, and simultaneously, the reactive oxygen species can oxidize and decompose organic matters. Through the above, particles including organic matters can be more rapidly decomposed.

In the oxidation atmosphere, the atmospheric gas may include the reactive oxygen precursor in an amount of 5 volume % or more. In the oxidation atmosphere, the atmospheric gas may include the reactive oxygen precursor in an amount of 30 volume % or less. In such a case, the particles including organic matters can be more rapidly removed, and it is possible to suppress excessive attenuation of the pre-treatment light by the atmospheric gas.

The first cleaning operation may be performed at a temperature of 10 to 50° C. The first cleaning operation may be performed at a temperature of 15 to 30° C. The first cleaning operation may be performed at a room temperature. In such a case, flatness change of the cleaning target substrate due to heat can be suppressed.

The first cleaning operation may be performed under a humidity of 20 to 70%. The first cleaning operation may be performed under a humidity of 30 to 50%. In such a case, it is possible to prevent that the intensity of the pre-treatment light for irradiation becomes excessively weak due to moisture included in the atmospheric gas.

The substrate cleaned with light is a substrate, from which some of or all of compounds, which absorb light with wavelength of 100 to 190 nm and disposed on the surface of the cleaning target substrate, are removed. The compound, which absorbs light with wavelength of 100 to 190 nm, refers to organic matters, in which bonds between molecules are broken to be oxidized and decomposed when irradiated by a light with wavelength of 100 to 190 nm. Such organic matters may be one made from floating matters adsorbed to the substrate surface while manufacturing and storing the substrate. Such organic matters may form a defect in a thin film when the thin film is formed on the substrate surface, and the substantial removal thereof is required.

Through the first cleaning operation, organic matters made from particles present on the surface of the cleaning target substrate can be effectively removed before the cleaning is performed by applying a first cleaning solution and a post-treatment light.

The cleaning method of the substrate for a blank mask of an embodiment includes a second cleaning operation of applying a first cleaning solution and a post-treatment light to prepare the substrate for a blank mask.

The second cleaning operation may be performed in the same space where the first cleaning operation is performed. The second cleaning operation may be performed in a different space from where the first cleaning operation is performed.

A light source may be disposed for a light with a uniform intensity overall to irradiate the surface of the substrate cleaned with light. The light source may irradiate the surface of the substrate cleaned with light with a post-treatment light. The light source may be for example, a UV lamp. The light source may be for example, a laser light source controlled in the wavelength.

One or more light sources may be disposed within the space, where the second cleaning operation is performed, for a light with a uniform intensity overall to irradiate the surface of the substrate cleaned with light.

In the second cleaning operation, the first cleaning solution may be injected on the surface of the substrate cleaned with light, and then the surface of the substrate cleaned with light may be irradiated with the post-treatment light. In the second cleaning operation, the surface of the substrate cleaned with light may be irradiated with the post-treatment light, and then the first cleaning solution may be injected on the surface of the substrate cleaned with light. In the second cleaning operation, the first cleaning solution may be injected on the surface of the substrate cleaned with light and the surface of the substrate cleaned with light may be irradiated with the post-treatment light at the same time.

In the second cleaning operation, when the first cleaning solution is injected on the surface of the substrate cleaned with light and the substrate surface is irradiated with the post-treatment light, energy may be delivered to the hydroxyl radical precursor included in the first cleaning solution from the post-treatment light to form a hydroxyl radical. The hydroxyl radical has high affinity with the substrate. The hydroxyl radical can oxidize and remove the materials inducing grain growth such as sulfuric acid and nitric acid remaining on the substrate surface that have not been removed. In such a case, it is possible to prevent the materials inducing grain remaining on the substrate surface from being exposed to an exposure light and moisture to form a grain on the substrate surface during the manufacturing process of the blank mask or the exposure process.

In addition, when the surface of the substrate cleaned with light is irradiated with the post-treatment light, the substrate surface cleaned with light may be activated. That is, affinity of the substrate surface with respect to the first cleaning solution may be increased by the post-treatment light having a controlled wavelength. The post-treatment light incident to the substrate surface cleaned with light may transfer energy to the substrate surface, and thereby some of bonds between elements composing the substrate surface may be broken. The substrate surface may have a high energy, and may react with a hydroxyl radical and the like included in the first cleaning solution. A functional group with a relatively high polarity may be formed on the substrate surface, and affinity of the substrate surface to the first cleaning solution may be increased temporarily. In such a case, it is possible to improve the cleaning effect of the substrate surface through the first cleaning solution during the second cleaning operation, and organic matters can be easily removed by decreasing affinity between the organic matters and the substrate surface.

In the second cleaning operation, the cleaning target surface within the substrate cleaned with light may be irradiated with the post-treatment light. In such a case, the surface energy of the surface of the cleaning target may be easily adjusted within a predetermined range of the embodiment.

A hydroxyl radical has a considerably short lifetime and become extinct easily while being cleaned. There is a difficulty to maintain steady amount of the hydroxy radical or to form large amount of the hydroxy radical temporarily. However, in the embodiment, the first cleaning solution is allowed to contact with the surface of a cleaning target of the substrate, and a post-treatment light directly irradiates the first cleaning solution contacted with the surface of the cleaning target, thereby maintaining hydroxyl radicals in a sufficient amount for obtaining a cleaning effect on the substrate surface.

The post-treatment light may be a light with a wavelength of 50 nm to 450 nm. The post-treatment light may be a light with a wavelength of 70 nm to 350 nm. The post-treatment light may be a light with a wavelength of 100 nm to 300 nm. In such a case, the surface energy of the substrate can be easily regulated to satisfy the requirement of the embodiment, and the hydroxyl radicals in the first cleaning solution can be efficiently generated.

The wavelength of the post-treatment light may be longer than the wavelength of the pre-treatment light. The value of subtracting the wavelength value of the pre-treatment light from the wavelength value of the post-treatment light may be 50 nm or more. The value of subtracting the wavelength value of the pre-treatment light from the wavelength value of the post-treatment light may be 70 nm or more. The value of subtracting the wavelength value of the pre-treatment light from the wavelength value of the post-treatment light may be 100 nm or more. The value of subtracting the wavelength value of the pre-treatment light from the wavelength value of the post-treatment light may be 150 nm or more. The value of subtracting the wavelength value of the pre-treatment light from the wavelength value of the post-treatment light may be 250 nm or less. The value of subtracting the wavelength value of the pre-treatment light from the wavelength value of the post-treatment light may be 200 nm or less. In such a case, it is possible to allow the first cleaning solution to absorb the light energy from the post-treatment light easily in the second cleaning operation.

When the irradiation of pre-treatment light is made by two or more light sources, in calculating the value of subtracting the wavelength value of the pre-treatment light from the wavelength value of the post-treatment light, an average wavelength of pre-treatment lights among respective light sources is considered as the wavelength value of the pre-treatment light and an average wavelength of post-treatment lights among respective light sources is considered as the wavelength value of the post-treatment light.

An intensity of the post-treatment light may be 30 $mW/cm^2$ or less, 20 $mW/cm^2$ or less, 10 $mW/cm^2$ or less, or 8 $mW/cm^2$ or less. The intensity of the post-treatment light may be 6 $mW/cm^2$ or less. The intensity of the post-treatment light may be 4 $mW/cm^2$ or less. The intensity of the post-treatment light may be 0.5 $mW/cm^2$ or more. The intensity of the post-treatment light may be 1 mW/cm$^2$ or more. The intensity of the post-treatment light may be 2 mW/cm$^2$ or more. In such a case, hydroxyl radicals in a sufficient amount for cleaning the surface of the substrate cleaned with light may be generated.

Irradiation of the post-treatment light may be made for a time of 20 seconds to 200 seconds. Irradiation of the post-treatment light may be made for a time of 30 seconds to 150 seconds. Irradiation of the post-treatment light may be made for a time of 50 seconds to 100 seconds. In such a case, the time for the cleaning process can be reduced while organic matters and residual ions remaining on the substrate are efficiently removed.

In the second cleaning operation, the cleaning target substrate may be irradiated with the post-treatment light through two or more light sources. In such a case, the whole surface of the substrate cleaned with light can be irradiated with the post-treatment light having sufficient intensity for forming hydroxyl radicals.

As the light source for irradiation of the post-treatment, for example, a low-pressure mercury lamp may be applied.

The first cleaning solution may be injected to the surface of the substrate cleaned with light through a nozzle in the second cleaning operation. The first cleaning solution may be injected through one or more nozzles to disperse the first cleaning solution evenly on the surface of the substrate cleaned with light overall.

The first cleaning solution may include a hydroxyl radical precursor. The hydroxyl radical precursor is a material that receives energy from the post-treatment light to form a hydroxyl radical. The hydroxyl radical precursor may be for example, $H_2O$, $H_2O_2$, $O_3$, and the like.

The first cleaning solution may include at least one selected from the group consisting of SC-1 (Standard Clean-1) solution (the SC-1 solution is a solution including $NH_4OH$, $H_2O_2$ and $H_2O$), ozone water, ultrapure water, hydrogen water, and carbonated water. In such a case, the organic matter particles remaining without being cleaned in the first cleaning operation can be effectively oxidized and removed through the first cleaning solution, and hydroxyl radicals in a sufficient amount can be formed through the post-treatment light.

A total flow rate of the first cleaning solution injected to the surface of the substrate cleaned with light having an area of 100 cm$^2$ to 300 cm$^2$ may be 2000 ml/min or more. The total flow rate of the first cleaning solution may be 3000 ml/min or more. The total flow rate of the first cleaning solution may be 5000 ml/min or less. In such a case, hydroxyl radicals can be supplied in a sufficient amount to the surface of the substrate cleaned with light, and particles remaining after the first cleaning operation can be sufficiently removed.

The second cleaning operation may be performed at a temperature of 10° C. to 100° C. The second cleaning operation may be performed at a temperature of 30° C. to 70° C. The second cleaning operation may be performed at a room temperature. In such a case, it is possible to prevent the flat substrate cleaned with light from being deformed due to the atmospheric temperature.

The cleaning method of the substrate for a blank mask of the embodiment may include a wet cleaning operation for cleaning the surface of the substrate for a blank mask by using the second cleaning solution.

In the wet cleaning operation, it is possible to remove impurity remaining on the surface of the substrate for a blank mask by injecting the second cleaning solution. In detail, the substrate for a blank mask may include the front surface, where a thin film is formed, and the rear surface disposed to be opposite to the front surface. The second cleaning solution may be injected through nozzles to the front surface and the rear surface to clean the substrate for a blank mask.

The injection of the second cleaning solution may be made by a megasonic injection. A megasonic power applied to each nozzle may be more than 0 W and less than or equal to 50 W. A megasonic power applied to each nozzle may be more than or equal to 10 W and less than or equal to 45 W. The megasonic power of a nozzle applied to the front surface may have lower value than the megasonic power of a nozzle applied to the rear surface. Otherwise, the megasonic power of a nozzle applied to the front surface may have the same value as the megasonic power of a nozzle applied to the rear surface.

A megasonic frequency applied to each nozzle may be equal to or more than 0.5 MHz and less than or equal to 3 MHz. A megasonic frequency applied to each nozzle may be equal to or more than 0.8 MHz and less than or equal to 2 MHz. The megasonic frequency of a nozzle applied to the front surface may have a smaller value than the megasonic frequency of a nozzle applied to the rear surface. Otherwise, the megasonic frequency of a nozzle applied to the front surface may have the same value as the megasonic frequency of a nozzle applied to the rear surface.

The second cleaning solution may be one or more kinds of solutions. The second cleaning solution may be at least one selected from the group consisting of carbonated water, ozone water, hydrogen water, SC-1 solution, and ultrapure water.

A wet cleaning operation may be performed for 1 minute to 40 minutes. The wet cleaning operation may be performed for 2 minutes to 25 minutes.

In such a case, it is possible to help foreign matters present on the surface of the substrate for a blank mask to be substantially removed.

The cleaning method of the substrate for a blank mask may include an operation of rinsing and an operation of drying with respect to the substrate for a blank mask. Through this, a cleaning solution remaining on the surface of the substrate for a blank mask is removed and thereby the damage of the substrate and the formation of haze caused from the remaining cleaning solution may be prevented.

The rinsing operation may be performed with respect to the substrate for a blank mask after finishing the second cleaning operation. In the rinsing operation, at least one among ultrapure water, carbonated water and hydrogen water may be applied.

In the drying operation, the substrate for a blank mask after finishing the rinsing operation may be dried. In the drying operation, the substrate for a blank mask may be rotated in a speed within a predetermined range of the embodiment. Ramp-down method, which is applying an initial rotation speed of substrate to be a high value and subsequently gradually lowering the rotation speed, may be applied to the drying operation. Alternatively, ramp-up method, which is applying an initial rotation speed of substrate to be a low value and subsequently gradually increasing the rotation speed, may be applied to the drying operation.

When the Ramp-up method is applied in the drying operation, the minimum rotation speed of the substrate may be 0 rpm or more, 100 rpm or more, 500 rpm or more, 800 rpm or more, or 1000 rpm or more, and the maximum rotation speed of the substrate may be 3500 rpm or less, 3000 rpm or less, 2500 rpm or less, or 2000 rpm or less.

When the Ramp-down method is applied in the drying operation, the maximum rotation speed of the substrate may be 3500 rpm or less, 3000 rpm or less, 2500 rpm or less, 2000 rpm or less, and the minimum rotation speed of the substrate may be 0 rpm or more, 100 rpm or more, 500 rpm or more, 800 rpm or more, or 1000 rpm or more.

By applying the rinsing operation and drying operation to the substrate for a blank mask, the cleaning solution remaining on the substrate surface can be effectively removed.

The substrate for a blank mask cleaned through the cleaning method of the substrate for a blank mask described as above may include sulfuric acid ions in an amount of 0 ng/cm$^2$ to 0.1 ng/cm$^2$ or less, nitric acid ions in an amount of 0 ng/cm$^2$ to 0.4 ng/cm$^2$ or less, nitrous acid ions in an amount of 0 ng/cm$^2$ to 0.05 ng/cm$^2$ or less, and ammonium ions in an amount of 0 ng/cm$^2$ to 0.05 ng/cm$^2$ or less.

According to the method of an embodiment described above, residual ions, which have high affinity with the substrate surface and are difficult to be removed, can be effectively removed.

The amount of residual ions present on the substrate surface is measurable by using an ion chromatography method. In detail, a measuring target substrate is put into a clean bag, and ultrapure water is injected in the clean bag. The clean bag is soaked into a water tank at 90° C. for 120 minutes, and after that, an ion-lixiviation solution is obtained from the clean bag. Thereafter, the ion-lixiviation solution and elution are injected to an ion chromatography column to analyze the ion chromatography, thereby measuring weights by residual ions. The measured weights by residual ions are divided by the front surface area of a substrate for a blank mask and the amounts by residual ions are calculated.

For example, a solution including KOH, LiOH, MSA (MethaneSulfonic Acid), and NaOH was applied as an elution solution, and the flow rate of mobile phase may be equal to or more than 0.4 mL/min and less than or equal to 2.0 mL/min.

As the ion chromatography analyzing device, Dionex ICS-2100 Ion Chromatography model available from THERMO SCIENTIFIC corporation may be used.

The substrate for a blank mask, to which the cleaning method of the substrate for a blank mask is applied, may include sulfuric acid ions measured by an ion chromatography method in an amount of 0 ng/cm$^2$ to 0.1 ng/cm$^2$. The sulfuric acid ions may be included in an amount of 0.05 ng/cm$^2$ or less. The sulfuric acid ions may be included in an amount of 0.03 ng/cm$^2$ or less.

The substrate for a blank mask, to which the cleaning method of the substrate for a blank mask is applied, may include nitric acid ions measured by an ion chromatography method in an amount of 0 ng/cm$^2$ to 0.4 ng/cm$^2$. The nitric acid ions may be included in an amount of 0.3 ng/cm$^2$ or less. The nitric acid ions may be included in an amount of 0.2 ng/cm$^2$ or less. The nitric acid ions may be included in an amount of 0.1 ng/cm$^2$ or less. The nitric acid ions may be included in an amount of 0.05 ng/cm$^2$ or less.

The substrate for a blank mask, to which the cleaning method of the substrate for a blank mask is applied, may include nitrous acid ions measured by an ion chromatography method in an amount of 0 ng/cm$^2$ to 0.05 ng/cm$^2$. The nitrous acid ions may be included in an amount of 0.02 ng/cm$^2$ or less. The nitrous acid ions may be included in an amount of 0.02 ng/cm$^2$ or less. The nitrous acid ions may be included in an amount of 0.01 ng/cm$^2$ or less.

The substrate for a blank mask, to which the cleaning method of the substrate for a blank mask is applied, may include ammonium ions in an amount of 0 ng/cm$^2$ to 1.5 ng/cm$^2$. The ammonium ions may be included in an amount of 1.3 ng/cm$^2$ or less. The ammonium ions may be included in an amount of 1 ng/cm$^2$ or less. The ammonium ions may be included in an amount of 0.7 ng/cm$^2$ or less.

The substrate for a blank mask, to which the cleaning method of the substrate for a blank mask is applied, may include chlorine ions in an amount of 0 ng/cm$^2$ to 0.1 ng/cm$^2$. The ammonium ions may be included in an amount of 0.05 ng/cm$^2$ or less. The ammonium ions may be included in an amount of 0.01 ng/cm$^2$ or less.

In such a case, it is possible to suppress the formation of a grain defect on the substrate surface during the manufacturing process of the blank mask or an exposure process.

The substrate for a blank mask, to which the cleaning method of the substrate for a blank mask is applied, may have a PRE value of 90% or more according to Equation 2 below:

$$PRE(\%) = \frac{P_b - P_a}{P_b} \times 100 \qquad \text{[Equation 2]}$$

In Equation 2, Pb is the number of particles measured from the cleaning target substrate, and Pa is the number of particles measured from the substrate for a blank mask.

The detailed description of a method for measuring Pb value and Pa value will be made. In detail, a measuring target substrate sample is disposed in a defect tester. Subsequently, the number of particles is measured in an area of 146 mm vertically and horizontally within the surface of the substrate sample as a measuring target, by using a defect tester. When the number of particles is measured, a green light laser with the wavelength of 532 nm is used as a testing light, the power of the laser is 3000 mW (1050 mW as the power of the laser measured at the surface of the substrate as the measuring target), and the moving speed in a stage is set to be 2 for the measurement.

For example, Pb value and Pa value can be measured by using a defect tester of M6641S model available from LASERTEC.

A substrate for the blank mask, to which the cleaning method of the substrate for a blank mask is applied, may have a PRE value of 90% or more according to Equation 2 above. The PRE value may be 95% or more. The PRE value may be 99% or more. The PRE value may be 100% or less. In such a case, the substrate for a blank mask, in which defects in optical properties and defects in a thin film caused from particles are effectively decreased, can be provided.

Substrate for Blank Mask

The substrate for a blank mask according to another embodiment of the present disclosure may be a quartz substrate with a flatness of 0.5 μm.

When the flatness of the substrate for a blank mask is controlled, a variation in optical properties in the in-plane direction of a thin film to be formed on the substrate can be decreased. Also, when a pattern is developed on the wafer surface by using a photomask applied to the substrate, it is possible to suppress the occurrence of the pattern distortion.

The substrate for a blank mask is required to be cleaned before being used in the manufacture of the blank mask. The embodiment applies the cleaning method of the substrate for a blank mask described above, and thereby can provide the substrate for a blank mask including residual ions in a low amount and having controlled flatness.

The flatness of the substrate of the blank mask may be for example, measured by using UltraFlat model available from Corning Tropel Corporation.

The flatness of the substrate for a blank mask may be 0.5 μm or less. In such a case, a variation in optical properties in the in-plane direction of a thin film to be formed on the substrate may be decreased.

The substrate for a blank mask includes sulfuric acid ions in an amount of 0 ng/cm$^2$ to 0.1 ng/cm$^2$, nitric acid ions in an amount of 0 ng/cm$^2$ to 0.4 ng/cm$^2$, nitrous acid ions in an amount of 0 ng/cm$^2$ to 0.05 ng/cm$^2$, and ammonium ions in an amount of 0 ng/cm$^2$ to 0.05 ng/cm$^2$, as residual ions measured by an ion chromatography method.

The substrate for a blank mask may include chlorine ions in an amount of 0 ng/cm$^2$ to 0.1 ng/cm$^2$, as residual ions measured by an ion chromatography method.

By controlling the amount of ions remaining on the substrate for a blank mask, it is possible to suppress the occurrence of a pattern distortion on a wafer caused from a grain grown on the substrate surface. Particularly, even though a solution including ammonium ions such as SC-1 solution is applied as a cleaning solution for cleaning the substrate for a blank mask, the amount of ammonium ions remaining on the substrate can be controlled not to influence the resolution of the blank mask.

The description of a measuring method of the amount of residual ions of a substrate for a blank mask by using an ion chromatography method is overlapped with the above description and thus omitted.

The substrate for a blank mask may include sulfuric acid ions measured by an ion chromatography method in an amount of 0 ng/cm$^2$ to 0.1 ng/cm$^2$. The sulfuric acid ions may be included in an amount of 0.05 ng/cm$^2$ or less. The sulfuric acid ions may be included in an amount of 0.03 ng/cm$^2$ or less.

The substrate for a blank mask may include nitric acid ions measured by an ion chromatography method in an amount of 0 ng/cm$^2$ to 0.4 ng/cm$^2$. The nitric acid ions may be included in an amount of 0.3 ng/cm$^2$ or less. The nitric acid ions may be included in an amount of 0.2 ng/cm$^2$ or less. The nitric acid ions may be included in an amount of 0.1 ng/cm$^2$ or less. The nitric acid ions may be included in an amount of 0.05 ng/cm$^2$ or less.

The substrate for a blank mask may include nitrous acid ions measured by an ion chromatography method in an amount of 0 ng/cm$^2$ to 0.05 ng/cm$^2$. The nitrous acid ions may be included in an amount of 0.02 ng/cm$^2$ or less. The nitrous acid ions may be included in an amount of 0.01 ng/cm$^2$ or less.

The substrate for a blank mask may include ammonium ions measured by an ion chromatography method in an amount of 0 ng/cm$^2$ to 1.5 ng/cm$^2$. The ammonium ions may be included in an amount of 1 ng/cm$^2$ or less. The ammonium ions may be included in an amount of 0.7 ng/cm$^2$ or less.

The substrate for a blank mask may include chlorine ions measured by an ion chromatography method in an amount of 0 ng/cm$^2$ to 0.1 ng/cm$^2$. The chlorine ions may be included in an amount of 0.05 ng/cm$^2$ or less. The chlorine ions may be included in an amount of 0.01 ng/cm$^2$ or less.

In such a case, growth of a crystal caused from residual ions can be effectively suppressed.

The substrate for a blank mask may be a substrate for a blank mask for a semiconductor having the size of 6 inched width, 6 inched length, and 0.25 inched height.

Blank Mask

The blank mask according to another embodiment of the present disclosure includes the substrate for a blank mask described above.

The blank mask may include the substrate for a blank mask and a thin film disposed on the substrate for a blank mask.

The thin film may include at least one selected from the group consisting of an etching stopper film, a phase shift film, a light shielding film, and an etching mask film.

Such a blank mask can effectively suppress degradation of resolution caused from an exposure process and can extend a cleaning cycle for removing haze.

Hereinafter, the present disclosure will be described in further detail with reference to accompanying examples. The following embodiments are only examples for understanding the present disclosure, and the range of the present disclosure is not limited to the same.

Evaluation Example: PRE (Particle Removal Efficiency) Test

As substrate samples for cleaning targets, identical synthetic quartz substrates with a width of 6 inches, a length of 6 inches, and a height of 0.25 inches kept in SMIF (Standard Mechanical InterFace) pods were opened inside defect tester per experimental samples. One surface of a substrate sample as a cleaning target was measured for images to obtain the number of observed particles. In detail, substrate samples for cleaning targets per experimental examples were disposed inside a defect tester of M6641S model available from LASERTEC. Subsequently, the number of particles was measured in an area of 146 mm vertically and horizontally within the substrate surface. When the number of particles was measured, a testing light is applied by a green light laser with a wavelength of 532 nm, the power of the laser was 3000 mW (the power of the laser measured at the surface of the substrate was 1050 mW), and the moving speed of a stage was 2.

Hereinafter, the first cleaning operation was performed for the substrate samples as cleaning targets per experimental examples to prepare substrate samples cleaned with light. In detail, the exhaust pressure of 0.350 kPa, the atmospheric temperature of 23° C., and the atmospheric humidity of 45%±5% were applied to a cleaning chamber, and an atmospheric gas, in which $O_2$ of 16.7 volume % and $N_2$ of 83.3 volume % were mixed, was introduced into the cleaning chamber, and the pre-treatment light source with a wavelength of 172 nm and an intensity of 40 mW/cm$^2$ was irradiated on the surface of the substrate sample as the cleaning target. The time for pre-treatment irradiation of each experimental examples was described in Table 1 below.

After completion of the first cleaning operation, the second cleaning operation was performed for the substrate sample cleaned with light of each experiment example, to prepare a sample of a substrate for a blank mask. In detail, the sample of the substrate cleaned with light was disposed in the second cleaning operation, and after that, ozone water in a flow rate of 2500 ml/min was injected through two nozzles. The dissolved ozone amount of the ozone water was 11.2 mg/L. A pre-treatment light source with a wavelength of 254 nm and an intensity of 8 mW/cm$^2$ was irradiated on the surface of the substrate cleaned with light through two light sources disposed on the sample of the substrate cleaned with light. The time for irradiation of the post-treatment light of each experimental examples was described in Table 1 below.

The wet cleaning operation was performed to the sample of the substrate for a blank mask after completion of the second cleaning operation. In detail, hydrogen water in a flow rate of 700 ml/min and SC-1 solution in a flow rate of 700 ml/min were injected to the surface of the substrate for a blank mask at the same time. The SC-1 solution was a solution including ammonia water of 0.1 volume %, oxygenated water of 0.08 volume %, and ultrapure water of 99.82 volume %.

The sample of the substrate for a blank mask after completion of the wet cleaning operation was rinsed with hydrogen water and carbonated water, and dried. Drying the substrate was performed by applying Ramp-up method with a minimum rotation speed for the substrate of 0 rpm and the final rotation speed for the substrate of 1500 rpm. Thereafter, the surface of the sample of the substrate for a blank mask of each experimental examples was measured for images to obtain the number of particles. The measurement for the number of particles on the surface of the sample of the substrate for a blank mask was performed under the same condition as the method of measuring the number of particles on the surface of the substrate as a cleaning operation.

The PRE (%) value according to Equation 2 of each experimental examples was calculated from the number of particles measured at the surface of the sample of the cleaning target substrate and the number of particles measured at the surface of the sample of the substrate for a blank mask after being rinsed and dried.

The PRE value calculated for each experimental examples was described in Table 1 below.

Evaluation Example: Measurement of Residual Ions

Example 1: A synthetic quartz substrate with a width of 6 inches, a length of 6 inches, a height of 0.25 inches, a flatness of 0.5 μm or less, and a birefringence of 5 nm or less was prepared as a substrate sample for cleaning target. As the result of measuring the surface of the synthetic quartz substrate for the images, a particle having a size of 60 nm or more was not found.

The first cleaning operation was performed for the substrate sample as a cleaning target to prepare a substrate sample cleaned with light. In detail, the exhaust pressure of 0.350 kPa, the atmospheric temperature of 23° C., and the atmospheric humidity of 45%±5% were applied to a cleaning chamber, and an atmospheric gas, in which 02 of 16.7 volume % and $N_2$ of 83.3 volume % were mixed, was introduced into the cleaning chamber. Subsequently, a pre-treatment light with a wavelength of 172 nm and an intensity of 40 mW/cm$^2$ was irradiated on the surface of the substrate sample as a cleaning target. The irradiation of pre-treatment light was performed for more than 100 seconds and less than or equal to 150 seconds.

After completion of the first cleaning operation, the second cleaning operation was performed for the sample of the substrate cleaned with light of each experimental examples to prepare the substrate sample for a blank mask. In detail, the substrate sample was disposed, and ozone water was injected in the flow rate of 2500 ml/min through two or more nozzles in the second cleaning operation. The dissolved amount of the ozone water was 11.2 mg/L. Through two light sources disposed on the substrate sample cleaned with light, the surface of the substrate cleaned with light was irradiated with the post-treatment light with the wavelength of 254 nm and the intensity of 8 mW/cm$^2$. The injection of ozone water and irradiation of the post-treatment light were performed at the same time or orderly within a short time. The time of irradiation of the post-treatment light of each experiment example was described in Table 1 below.

The wet cleaning operation was performed for the sample of the substrate for a blank mask after completion of the second cleaning operation. In detail, hydrogen water in the flow rate of 700 ml/min and SC-1 solution in the flow rate of 700 ml/min were injected at the same time to the surface of the substrate for a blank mask. The wet cleaning operation was performed for about 20 minutes. The SC-1 solution was a solution including ammonia water of 0.1 volume %, oxygenated water of 0.1 volume %, and ultrapure water of 99.82 volume %.

The sample of the substrate for a blank mask after completion of the wet cleaning operation was rinsed with hydrogen water and carbonated water, and dried. Drying the substrate was performed by applying Ramp-up method with the minimum rotation speed of the substrate of 0 rpm and the final rotation speed of the substrate of 1500 rpm.

The amount of residual ions present on the surface of the substrate for a blank mask after being rinsed and dried was measured by an ion chromatography method. In detail, the substrate as a measuring target was put into a clean bag, and ultrapure water of 100 ml was injected to the clean bag. After the clean bag was soaked into a water tank at 90° C. for 120 minutes, an ion-lixiviation solution and an eluent were injected to an ion chromatography column to analyze the ion chromatography, and the weight of ions was measured for respective ions. The weight of ions measured for respective ions was divided by surface area (504 cm$^2$) and the amounts for respective ions were calculated.

When the ion chromatography was performed, a solution including KOH, LiOH, MSA (MethaneSulfonic Acid), and NaOH was applied as the eluent, and the flow rate in mobile phase was equal to or more than 0.4 ml/min and less than or equal to 2.0 ml/min.

The analyzing apparatus of ion chromatography was Dionex ICS-2100 Ion Chromatography model available from THERMOSCIENTIFIC.

Example 2: The substrate for a blank mask was prepared under the same condition as Example 1, and the amount of residual ions was measured through ion chromatography for respective ions. However, the substrate was a synthetic quartz substrate with a width of 6 inches, a length of 6 inches, a height of 0.25 inches, a flatness of 0.5 μm, and a birefringence of 5 nm. Also, a substrate, where a particle with a size of 60 nm or more had been not found upon image measurement of the surface of the synthetic quartz substrate, was used as the sample of the cleaning target substrate.

Example 3: The substrate for a blank mask was prepared under the same condition as Example 1, and the amount of residual ions was measured for respective ions through ion chromatography. However, the time for irradiation of the pre-treatment light was more than 0 seconds and less than or equal to 50 seconds.

Example 4: The substrate for a blank mask was prepared under the same condition as Example 2, and the amount of residual ions was measured for respective ions through ion chromatography. However, the time for irradiation of the pre-treatment light was more than 0 seconds and less than or equal to 50 seconds.

Example 5: The substrate for a blank mask was prepared under the same condition as Example 1, and the amount of residual ions was measured for respective ions through ion chromatography. However, the time for irradiation of the pre-treatment light was more than 50 seconds and less than or equal to 100 seconds.

Example 6: The substrate for a blank mask was prepared under the same condition as Example 2, and the amount of residual ions was measured for respective ions through ion chromatography. However, the time for irradiation of the pre-treatment light was more than 50 seconds and less than or equal to 100 seconds.

Example 7: The substrate for a blank mask was prepared under the same condition as Example 1, and the amount of residual ions was measured for respective ions through ion chromatography. However, the time for irradiation of the post-treatment light was more than 0 seconds and less than or equal to 50 seconds.

Example 8: The substrate for a blank mask was prepared under the same condition as Example 2, and the amount of residual ions was measured for respective ions through ion chromatography. However, the time for irradiation of the post-treatment light was more than 0 seconds and less than or equal to 50 seconds.

Example 9: The substrate for a blank mask was prepared under the same condition as Example 1, and the amount of residual ions was measured for respective ions through ion chromatography. However, the time for irradiation of the post-treatment light was more than 100 seconds and less than or equal to 150 seconds.

Example 10: The substrate for a blank mask was prepared under the same condition as Example 2, and the amount of residual ions was measured for respective ions through ion chromatography. However, the time for irradiation of the post-treatment light was more than 100 seconds and less than or equal to 150 seconds.

Example 11: The substrate for a blank mask was prepared under the same condition as Example 1, and the amount of residual ions was measured for respective ions through ion chromatography. However, the time for irradiation of the post-treatment light was more than 150 seconds and less than or equal to 200 seconds.

Example 12: The substrate for a blank mask was prepared under the same condition as Example 2, and the amount of residual ions was measured for respective ions through ion chromatography. However, the time for irradiation of the post-treatment light was more than 150 seconds and less than or equal to 200 seconds.

Example 13: The substrate for a blank mask was prepared under the same condition as Example 1, and the amount of residual ions was measured for respective ions through ion chromatography. However, the time for irradiation of the pre-treatment light was more than 150 seconds and less than or equal to 200 seconds.

Example 14: The substrate for a blank mask was prepared under the same condition as Example 2, and the amount of residual ions was measured for respective ions through ion chromatography. However, the time for irradiation of the pre-treatment light was more than 150 seconds and less than or equal to 200 seconds.

Comparative Example 1: A synthetic quartz substrate with a flatness of 0.5 μm or less and a birefringence of 5 nm or less was prepared. As a result of image measurement of the surface of the synthetic quartz substrate, a particle having a size of 60 nm or more was not found. The amount of residual ions of the synthetic quartz substrate was measured for respective ions through ion chromatography. The measuring condition of ion chromatography was the same as Example 1.

Comparative Example 2: A synthetic quartz substrate with a flatness of 0.5 μm or less and a birefringence of 5 nm or less was prepared. As a result of image measurement of the surface of the synthetic quartz substrate, a particle having a size of 80 nm or more was not found. The amount of residual ions of the synthetic quartz substrate was measured for respective ions through ion chromatography. The measuring condition of ion chromatography was the same as Example 1.

Comparative Example 3: A synthetic quartz substrate with a flatness of 0.5 μm or less and a birefringence of 5 nm or less was prepared. As a result of image measurement of the surface of the synthetic quartz substrate, a particle having a size of 60 nm or more was not found.

A second cleaning operation was performed for the sample of the cleaning target substrate, while a first cleaning operation was not applied. The condition of the second cleaning operation was the same as Example 1. A wet cleaning operation, a rinsing operation, and a drying operation were performed for the sample of the substrate for the blank mask after completion of the second cleaning operation. The wet cleaning operation, the rinsing operation, and the drying operation were performed under the same condition as Example 1.

Residual ions of the sample of the substrate cleaned with light were measured through ion chromatography. The measuring condition of ion chromatography was the same as Example 1.

Comparative Example 4: A sample of a substrate cleaned with light under the same condition as Comparative Example 3 was prepared, and the amount of residual ions was measured for respective ions through ion chromatography. However, the substrate as the sample of the cleaning target substrate was a synthetic quartz substrate with a flatness of 0.5 μm or less and a birefringence of 5 nm or less, and as a result of image measurement, a particle having a size of 80 nm or more was not found in the substrate.

A first cleaning operation was not applied to the sample of the cleaning target substrate, and a second cleaning operation was performed to prepare a sample of a substrate for a blank mask. The condition of the second cleaning operation was the same as Example 1. A wet cleaning operation, a rinsing operation, and a drying operation were performed for the sample of the substrate for a blank mask after completion of the second cleaning operation. The wet cleaning operation, the rinsing operation, and the drying operation were performed under the same condition as Example 1.

The amount of residual ions measured for respective ions through ion chromatography of each Example and Comparative Example was described in Table 2 below.

TABLE 1

| | Time for Irradiation of Pre-treatment Light (s) | Time for Irradiation of Post-treatment Light (s) | PRE(%) |
|---|---|---|---|
| Experimental Example 1 | More than 0 and Less than or Equal to 50 | More than 0 and Less than or Equal to 50 | 77.3 |
| Experimental Example 2 | More than 0 and Less than or Equal to 50 | More than 0 and Less than or Equal to 50 | 88.2 |
| Experimental Example 3 | More than 0 and Less than or Equal to 50 | More than 100 and Less than or Equal to 150 | 87.9 |
| Experimental Example 4 | More than 0 and Less than or Equal to 50 | More than 150 and Less than or Equal to 200 | 87.8 |
| Experimental Example 5 | More than 50 and Less than or Equal to 100 | More than 0 and Less than or Equal to 50 | 82.2 |
| Experimental Example 6 | More than 50 and Less than or Equal | More than 50 and Less than or Equal | 92.7 |

TABLE 1-continued

| | Time for Irradiation of Pre-treatment Light (s) | Time for Irradiation of Post-treatment Light (s) | PRE(%) |
|---|---|---|---|
| | to 100 | to 100 | |
| Experimental Example 7 | More than 50 and Less than or Equal to 100 | More than 100 and Less than or Equal to 150 | 92.1 |
| Experimental Example 8 | More than 50 and Less than or Equal to 100 | More than 150 and Less than or Equal to 200 | 92.1 |
| Experimental Example 9 | More than 100 and Less than or Equal to 150 | More than 0 and Less than or Equal to 50 | 86.4 |
| Experimental Example 10 | More than 100 and Less than or Equal to 150 | More than 50 and Less than or Equal to 100 | 99.5 |
| Experimental Example 11 | More than 100 and Less than or Equal to 150 | More than 100 and Less than or Equal to 150 | 99.2 |
| Experimental Example 12 | More than 100 and Less than or Equal to 150 | More than 150 and Less than or Equal to 200 | 99.2 |
| Experimental Example 13 | More than 150 and Less than or Equal to 200 | More than 0 and Less than or Equal to 50 | 86.3 |
| Experimental Example 14 | More than 150 and Less than or Equal to 200 | More than 50 and Less than or Equal to 100 | 97.7 |
| Experimental Example 15 | More than 150 and Less than or Equal to 200 | More than 100 and Less than or Equal to 150 | 97.1 |
| Experimental Example 16 | More than 150 and Less than or Equal to 200 | More than 150 and Less than or Equal to 200 | 97.0 |

TABLE 2

| | Type of Substrate as Cleaning | The Amount of Residual Ions for Respective Ions (ng/cm$^2$) | | | | |
|---|---|---|---|---|---|---|
| | Target* | $Cl^-$ | $NO_2^-$ | $NO_3^-$ | $SO_4^{2-}$ | $NH_4^+$ |
| Example 1 | A | 0.01 | 0.01 | 0.09 | 0.02 | 0.54 |
| Example 2 | B | 0.01 | 0 | 0.02 | 0.02 | 1.00 |
| Example 3 | A | 0.01 | 0.01 | 0.19 | 0.05 | 0.66 |
| Example 4 | B | 0.01 | 0 | 0.11 | 0.04 | 1.14 |
| Example 5 | A | 0.01 | 0 | 0.17 | 0.04 | 0.62 |
| Example 6 | B | 0.01 | 0 | 0.10 | 0.03 | 1.04 |
| Example 7 | A | 0.01 | 0.01 | 0.20 | 0.04 | 0.71 |
| Example 8 | B | 0.01 | 0 | 0.12 | 0.04 | 1.20 |
| Example 9 | A | 0.01 | 0 | 0.13 | 0.03 | 0.59 |
| Example 10 | B | 0.01 | 0 | 0.05 | 0.03 | 1.08 |
| Example 11 | A | 0.01 | 0 | 0.14 | 0.03 | 0.58 |
| Example 12 | B | 0.01 | 0 | 0.07 | 0.03 | 1.06 |
| Example 13 | A | 0.01 | 0.01 | 0.15 | 0.03 | 0.61 |
| Example 14 | B | 0.01 | 0 | 0.07 | 0.03 | 1.02 |
| Comparative Example 1 | A | 0.01 | 0 | 0.26 | 0.06 | 0.19 |
| Comparative Example 2 | B | 0.01 | 0 | 0.11 | 0.06 | 0.94 |
| Comparative Example 3 | A | 0.01 | 0.01 | 0.21 | 0.05 | 1.12 |
| Comparative Example 4 | B | 0.01 | 0 | 0.10 | 0.05 | 2.23 |

*Type A of Substrate as Cleaning Target is a synthetic quartz substrate with a width of 6 inches, a length of 6 inches, a height of 0.25 inches, a flatness of 0.5 μm or less, a birefringence of 5 nm or less, and as a result of image measurement for the surface, a particle having a size of 60 nm or more have been not found. Type B of Substrate as Cleaning Target is a synthetic quartz substrate with a width of 6 inches, a length of 6 inches, a height of 0.25 inches, a flatness of 0.5 μm or less, a birefringence of 5 nm or less, and as a result of image measurement for the surface, a particle having a size of 80 nm or more have been not found.

In Table 1, Experimental Examples 1 to 16 show PRE values of 75% or more. Particularly, when Time for Irradiation of Pre-treatment Light was more than 50 seconds and Time for Irradiation of Post-treatment Light was more than 50 seconds, PRE values show a value of 90% or more.

In Table 2, the amounts of sulfuric acid ions, nitric acid ions, nitrous acid ions, and ammonium ions measured by ion chromatography was included within the range limited in the embodiments. Particularly, the amounts of nitric acid ions and sulfuric acid ions of Examples 1 to 14 show a lower value than the values of Comparative Examples.

For ammonium ions, the amounts measured in Examples 1 to 14 were higher than in Comparative Examples 1 and 2, in which cleaning using SC-1 solution had been not performed. This is considered to be influenced by $NH_4$ ions included in SC-1 solution, which has been applied as a cleaning solution. However, the amount of ammonium was observed as lower in Examples 1 to 14 than in Comparative Examples 3 and 4, in which cleaning with light has been performed through irradiation of a post-treatment light.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A method of cleaning a substrate for a blank mask, comprising:

a first cleaning step of irradiating a cleaning target substrate for a blank mask with a pre-treatment light to prepare a substrate for a blank mask cleaned with light; and a second cleaning step of applying a first cleaning solution and a post-treatment light to the substrate for the blank mask cleaned with light to prepare the substrate for the blank mask, wherein an intensity of the pre-treatment light is 25 mW/cm$^2$ or more, wherein the first cleaning step is performed in a depressurizing atmosphere having an exhaust pressure of 0.01 kPa to 1 kPa, wherein a wavelength of the post-treatment light is longer than a wavelength of the pre-treatment light, and the post-treatment light is irradiated on the first cleaning solution while the first cleaning solution is in contact with a surface of the substrate cleaned with light to form hydroxyl radicals, wherein the cleaning target substrate for the blank mask is irradiated with the pre-treatment light from two or more light sources, and wherein a UI (Uniform Intensity) value of the pre-treatment light from the two or more light sources according to Equation 1 below is 20% or less:

$$UI(\%) = \frac{I_{max} - I_{min}}{I_{max} + I_{min}} \times 100 \quad \text{[Equation 1]}$$

where, in Equation 1, $I_{max}$ is a maximum intensity among intensities of the pre-treatment light from the two or more light sources and Imin is a minimum intensity among intensities of the pre-treatment light from the two or more light sources.

2. The method of claim 1, wherein the pre-treatment light is a light with a wavelength of 50 nm to 300 nm.

3. The method of claim 1, wherein the post-treatment light is a light with wavelength of 50 nm to 450 nm.

4. The method of claim 1, wherein the first cleaning solution comprises at least one selected from the group consisting of SC-1 (Standard Clean-1) solution comprising $NH_4OH$, $H_2O_2$, and $H_2O$, ozone water, ultrapure water, hydrogen water, and carbonated water.

5. The method of claim 1, wherein the substrate for the blank mask cleaned with light is one, from which some or all of compounds absorbing a light with a wavelength of 100 to 190 nm are removed.

6. The method of claim 1, wherein the first cleaning solution comprises a hydroxyl radical precursor.

7. The method of claim 6, wherein a hydroxyl radical is formed from the hydroxyl radical precursor when the first cleaning solution is applied and the post-treatment light is irradiated on the first cleaning solution while the first cleaning solution is in contact with the substrate for the blank mask cleaned with light.

8. The method of claim 1, wherein the substrate for the blank mask comprises a sulfuric acid ion in an amount of 0 $ng/cm^2$ to 0.1 $ng/cm^2$, a nitric acid ion in an amount of 0 $ng/cm^2$ to 0.4 $ng/cm^2$, a nitrous acid ion in an amount of 0 $ng/cm^2$ to 0.05 $ng/cm^2$, and an ammonium ion in an amount of 0 $ng/cm^2$ to 1.5 $ng/cm^2$, as residual ions measured by an ion chromatography.

9. The method of claim 1, wherein the PRE (Particle Removal Efficiency) value of the substrate for the blank mask is 90% or more according to Equation 2 below:

$$PRE(\%) = \frac{P_b - P_a}{P_b} \times 100 \quad \text{[Equation 2]}$$

where, in Equation 2, $P_b$ is a number of particles measured at the cleaning target substrate for the blank mask and $P_a$ is a number of particles measured at the substrate for the blank mask.

* * * * *